United States Patent
Deng et al.

(10) Patent No.: US 9,678,435 B1
(45) Date of Patent: Jun. 13, 2017

(54) HORIZONTAL DEVELOPMENT BIAS IN NEGATIVE TONE DEVELOPMENT OF PHOTORESIST

(71) Applicant: Mentor Graphics Corporation, Wilsonville, OR (US)

(72) Inventors: Yunfei Deng, Fremont, CA (US); Yuri Granik, Palo Alto, CA (US); Dmitry Medvedev, Los Altos, CA (US); Yuan He, Lake Oswego, OR (US); Konstantinos Adam, Belmont, CA (US)

(73) Assignee: Mentor Graphics, A Siemens Business, Wilsonville, OR (US)

( * ) Notice: Subject to any disclaimer, the term of this patent is extended or adjusted under 35 U.S.C. 154(b) by 200 days.

(21) Appl. No.: 14/493,073

(22) Filed: Sep. 22, 2014

(51) Int. Cl.
 *G06F 17/50* (2006.01)
 *G03F 7/20* (2006.01)

(52) U.S. Cl.
 CPC ................. *G03F 7/70083* (2013.01)

(58) Field of Classification Search
 CPC . G03F 7/705; G03F 1/144; G03F 1/36; G03F 7/70441; G03F 7/70425; G03F 7/70433; G03F 7/095; G03F 7/70; G06F 17/5081; G06F 17/50; G06F 2217/12; H01L 21/0274; H01L 21/3085
 See application file for complete search history.

(56) References Cited

U.S. PATENT DOCUMENTS

| | | | | |
|---|---|---|---|---|
| 6,114,082 A * | 9/2000 | Hakey | ..................... | G03F 7/038 257/E21.012 |
| 7,073,162 B2 | 7/2006 | Cobb et al. | | |
| 7,378,202 B2 | 5/2008 | Granik | | |
| 2005/0273753 A1* | 12/2005 | Sezginer | ............. | G03F 7/70425 716/52 |
| 2007/0061773 A1* | 3/2007 | Ye | ....................... | G03F 7/70441 716/52 |
| 2014/0042340 A1* | 2/2014 | Hell | ..................... | G01N 21/645 250/459.1 |

OTHER PUBLICATIONS

Stewart A. Robertsona, et al., "Negative Tone Development: Gaining insight through physical simulation", Proc. of SPIE vol. 7972 (2011).
G. Landie, et al., "Fundamental Investigation of Negative Tone Development (NTD) for the 22nm node (and beyond)", Proc. of SPIE vol. 7972 (2011).

(Continued)

*Primary Examiner* — Vuthe Siek

(57) ABSTRACT

Aspects of the disclosed techniques relate to techniques for resist simulation in lithography. Local minimal light intensity values are determined for a plurality of sample points in boundary regions of an aerial image of a feature to be printed on a resist coating, wherein each of the local minimal light intensity values represents a minimum light intensity value for an area surrounding one of the plurality of sample points. Based on the local minimal light intensity values, horizontal development bias values for the plurality of sample points are then determined. Finally, resist contour data of the feature are determined based at least on the horizontal development bias values.

9 Claims, 7 Drawing Sheets

(56) References Cited

OTHER PUBLICATIONS

T. V. Pistor, "Photoresist shrinkage effects at EUV", , Proc. of SPIE vol. 7969 (2011).
T.A. Brunner, et al., "Approximate models for resist processing effects", Proc. of SPIE vol. 2726 (1996).
Y. Granik, et al., "Application of CM0 resist model to OPC and verification," Proc. of SPIE vol. 6154 (2006).
Stewart A. Robertsona, et al., "Physical Resist Simulation for a negative tone development process," Immersion Extensions (2010).

\* cited by examiner

TPS.SbF$_6$ t-BOC protected pHOST

HORIZONTAL DEVELOPMENT BIAS IN NEGATIVE TONE DEVELOPMENT OF PHOTORESIST

FIELD OF THE DISCLOSED TECHNIQUES

The disclosed techniques relates to the field of lithography. Various implementations of the disclosed techniques may be particularly useful for predicting how features are printed on a wafer.

BACKGROUND OF THE DISCLOSED TECHNIQUES

The semiconductor industry has been using photolithography to build integrated circuits on silicon wafers for decades. In the patterning process of photolithography, a polymer film called a photoresist is deposited over a thin film of one of a variety of materials on a silicon wafer. Next, in an exposure tool, light of a very specific wavelength is projected through a pattern-bearing mask onto the photoresist. Regions of the photoresist exposed to the light undergo chemical changes, making them either more or less susceptible (depending on the process) to being removed in a subsequent chemical developing process. The pattern of the mask with various features is thus transferred to the photoresist. These features represent electronic components (e.g., contacts, channels, gates, wires, etc.). Through a subsequent process of chemical and/or physical etching, the pattern of the photoresist is then transferred to the underlying thin film. Multiple iterations of this thin-film patterning process, along with several other physical processes, produce integrated circuits.

Continuous reduction in sizes of the printed features has enabled miniaturization of electronic devices, exponential increases in functionality, and dramatic decreases in cost that characterize Moore's law. This has been facilitated by lowering wavelength of the exposure light from near ultraviolet (UV) to deep ultraviolet. Making the leap to deep ultraviolet would require dramatic materials innovations and a change in photoresist technology. The standard type of near-UV photoresist, known as the DNQ-Novolac resist, utilizes a hydrogen bonding-based interaction to control dissolution inhibition/acceleration of the novolac resin via the photoreaction of the DNQ molecule. This dissolution inhibition mechanism had been successfully applied as the primary imaging mechanism for nearly 30 years in G-line (436 nm) and I-line (365 nm) lithography before the problems in resist sensitivity were encountered in switching to 248 nm.

To address the photosensitivity issue, an entirely new breed of photoresist—chemically amplified photoresists—was developed. The chemistry comprises two main steps. First, a chemically amplified resist produces a catalyst through an initial photochemistry reaction upon exposure to light. The catalyst then interacts with the surrounding polymer matrix to pursue a cascade of chain reactions which can chemically enhance the resist imaging process. These chemically amplified photoresists have become the workhorse resist materials of the semiconductor industry for about 20 years, being utilized in both of the 248 nm and 193 nm photolithography technologies.

One example of a chemically amplified photoresist comprises a poly(4-hydroxystyrene) (pHOST) protected by an acid-labile tert-butoxycarbonyl (t-BOC) functional group and a triphenylsulfonium hexafluoroantimonate (TPS.SbF$_6$), as shown in FIG. 3. The TPS.SbF$_6$ is a photoactive compound which can generate acid after being exposed to light. The acid generation process is shown in FIG. 4A, in which the TPS.SbF$_6$ molecule absorbs a photon and produces a strong hexafluoroantimonic acid molecule (H$^+$SbF$_6^-$). This type of photoactive material is referred to as the photo acid generator (PAG). The acid generated by the photo acid generator then catalyzes the cleavage of the t-BOC groups in a post-exposure bake process as shown in FIG. 4B. The deprotection reaction not only changes the polymer from hydrophobic to hydrophilic, but also generates additional acid, catalyzing further t-BOC cleavages in a cascade of deprotection. The cascade of deprotection amplifies the effect of the photochemical event, yielding a great sensitivity. As opposed to hydrogen bond based interaction which regulates dissolution inhibition/acceleration in novolac/DNQ resists, the protection/deprotection scheme used in chemical amplification system provides resin polarity switch that leads to extraordinary solubility differences (more than 5-order dissolution rate difference in aqueous base solutions).

An exposed chemically amplified photoresist film may be developed with a positive-tone developer or a negative-tone developer. The former had been employed dominantly until recently. In a positive tone development application, the deprotected polymer is formed in the exposed regions of the film after a light exposure through a bright-field mask and a subsequent post exposure bake. An aqueous base solution (e.g., tetramethylammonium hydroxide (TMAH) solution) is used to wash away the deprotected polymer, leaving features on wafer resembling the pattern of the mask. While used successfully in several technology nodes, this process is facing challenges in printing small contacts and narrow trenches. In comparison, the negative tone development, using a non-polar organic solvent such as anisole to dissolve the protected polymer, enables better narrow trench patterning. This technique, along with other techniques such as resolution enhancement and double-patterning techniques, extends 193 nm-immersion lithography to at least the 14 nm node regime.

Various resolution enhancement techniques have been used to correct diffractive effects of light and to improve the fidelity with which the desired pattern is printed on the wafer. In most of the resolution enhancement techniques such as optical proximity correction (OPC), a simulation is made of how a feature will print on a wafer. The simulation is then used to adjust a pattern contained on a mask or reticle in a way that compensates for the expected distortions. As part of the simulation, a model is often used to predict how the light sensitive resist materials will behave when exposed with a particular mask pattern. Typically, simulations are conducted at sparsely chosen sampling locations or sites to reduce the overall processing time spent on simulation. The local values of image intensity and related other properties, such as derivatives, are calculated at these simulation sites to estimate the behavior of the resist at that point. Suitable site selection procedures are disclosed by, for example, U.S. Pat. No. 7,073,162, which is incorporated herein by reference, to ensure the best representation when a sampling approach is taken.

An alternative simulation technique, disclosed in U.S. Pat. No. 7,378,202 which is incorporated herein by reference, is grid-based. In this technique, image intensity values are calculated at a grid of points on the wafer, and the image intensity values are supplied to a resist simulator that produces a resist surface function. The resist surface function may be a linear combination of modeling terms. Each of the modeling terms may be a result of a sequence of operators applied to the aerial image. By thresholding of the resist surface function, a resist contour that estimates the pattern of features to be formed on a wafer may be obtained. This resist model is often referred to as Compact Model 1 (CM1) resist model.

While conventional resist simulators including those discussed above have been successfully employed to predict how features will print on a wafer through a positive-tone development process, these simulators could not provide a complete description of some photoresists in a negative-tone development process, resulting in poor matches between simulated and experimentally measured data. In particular, systematic errors occur with one-dimensional grating-type features and two-dimensional pillar-type features. One cause of the systematic errors is due to unique characteristics of the development rate for the negative tone development, e.g., the relatively fast development rate in regions exposed by light (minimum development rate) and the relatively slow development rate in regions unexposed by light (maximum development rate). It is desirable to develop a resist model that can account for effects of the large minimum development rate.

BRIEF SUMMARY OF THE DISCLOSED TECHNIQUES

Aspects of the disclosed techniques relate to techniques for resist simulation in lithography. In one aspect, there is a method comprising: determining local minimal light intensity values for a plurality of sample points in boundary regions of an aerial image of a feature to be printed on a resist coating, wherein each of the local minimal light intensity values represents a minimum light intensity value for an area surrounding one of the plurality of sample points; determining horizontal development bias values for the plurality of sample points based on the local minimal light intensity values; and computing resist contour data of the feature based at least on the horizontal development bias values.

The local minimal light intensity values may be approximately determined according to $$I_m(x, y) = \frac{1}{2*b} * (b^2 - ((I_{-b})^2 \otimes G_s)(x, y)),$$

where $$G_s(x, y) = \frac{1}{\pi s^2} \exp\left(-\frac{x^2 + y^2}{s^2}\right)$$

and wherein the horizontal development bias values are determined according to $$H(x, y) = c * \sqrt{a^2 + (I_m(x, y))^2} * \sqrt{\left(\frac{\partial I(x, y)}{\partial x}\right)^2 + \left(\frac{\partial I(x, y)}{\partial y}\right)^2}.$$

The horizontal development bias values are determined at any resist plane inside the resist film according to $$\Delta x \approx R\min * [t_{dev} - h * \max(1/R\max, I\min^{|\gamma|}/r_0)]$$

In another aspect, there is a non-transitory processor-readable medium storing processor-executable instructions for causing one or more processors to perform a method, the method comprising: determining local minimal light intensity values for a plurality of sample points in boundary regions of an aerial image of a feature to be printed on a resist coating, wherein each of the local minimal light intensity values represents a minimum light intensity value for an area surrounding one of the plurality of sample points; determining horizontal development bias values for the plurality of sample points based on the local minimal light intensity values; and computing resist contour data of the feature based at least on the horizontal development bias values.

In still another aspect, there is a system, comprising: a local minimum light intensity determination unit configured to determine local minimal light intensity values for a plurality of sample points in boundary regions of an aerial image of a feature to be printed on a resist coating, wherein each of the local minimal light intensity values represents a minimum light intensity value for an area surrounding one of the plurality of sample points; a horizontal development bias values determination unit configured to determine horizontal development bias values for the plurality of sample points based on the local minimal light intensity values; and a resist contour simulation unit configured to compute resist contour data of the feature based at least on the horizontal development bias values.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Figure 1:
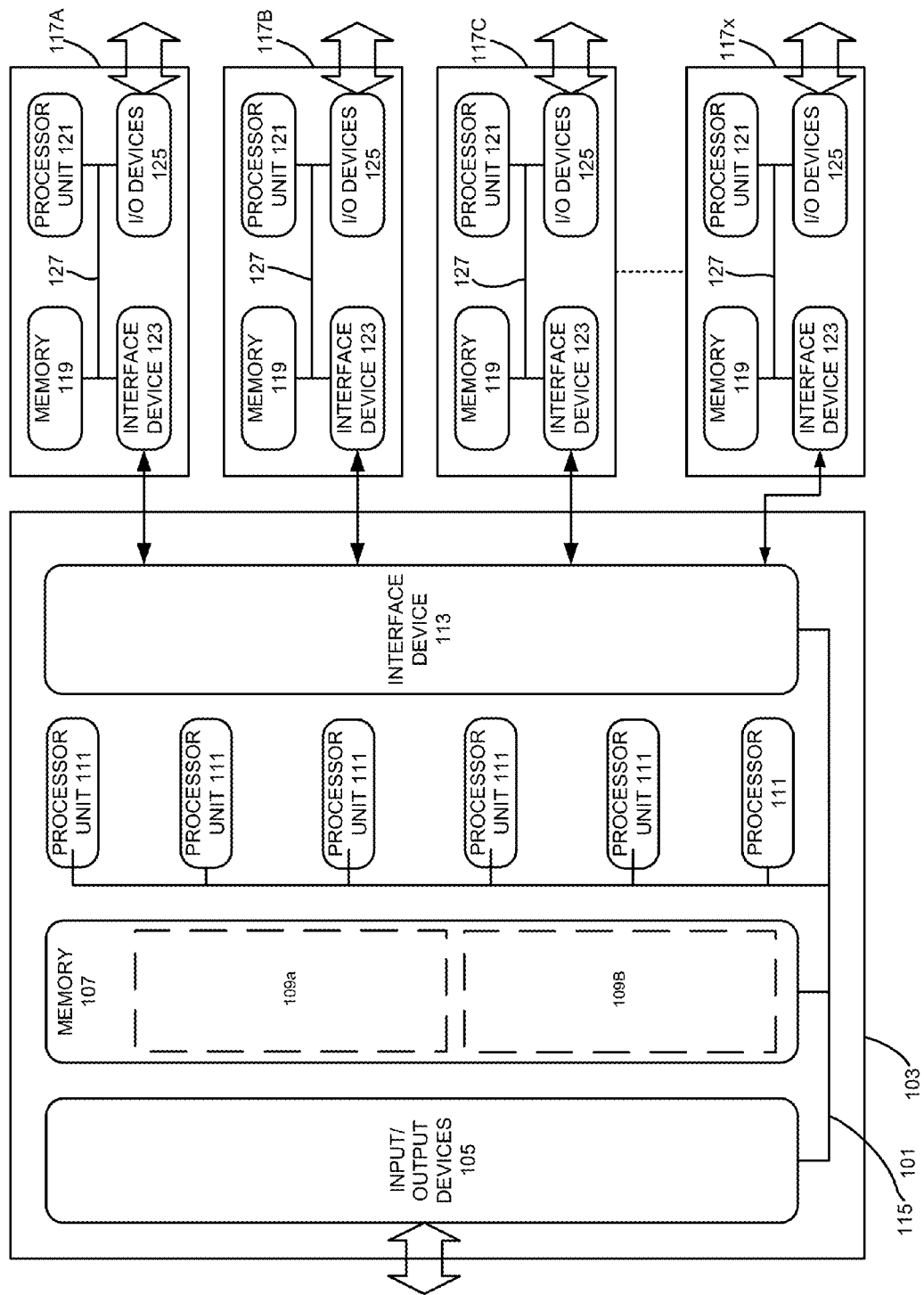
FIG. 1 illustrates an example of a computing system that may be used to implement various embodiments of the disclosed techniques.

Various aspects of the present disclosed techniques relate to techniques for resist simulation in lithography. In the following description, numerous details are set forth for the purpose of explanation. However, one of ordinary skill in the art will realize that the disclosed techniques may be practiced without the use of these specific details. In other instances, well-known features have not been described in details to avoid obscuring the present disclosed techniques.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" and "compute" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the disclosed techniques may be implemented using computer-executable software instructions executed by one or more programmable computing devices. Because these embodiments of the disclosed techniques may be implemented using software instructions, the components and operation of a generic programmable computer system on which various embodiments of the disclosed techniques may be employed will first be described. Further, because of the complexity of some electronic design automation processes and the large size of many circuit designs, various electronic design automation tools are configured to operate on a computing system capable of concurrently running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed techniques.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed techniques. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
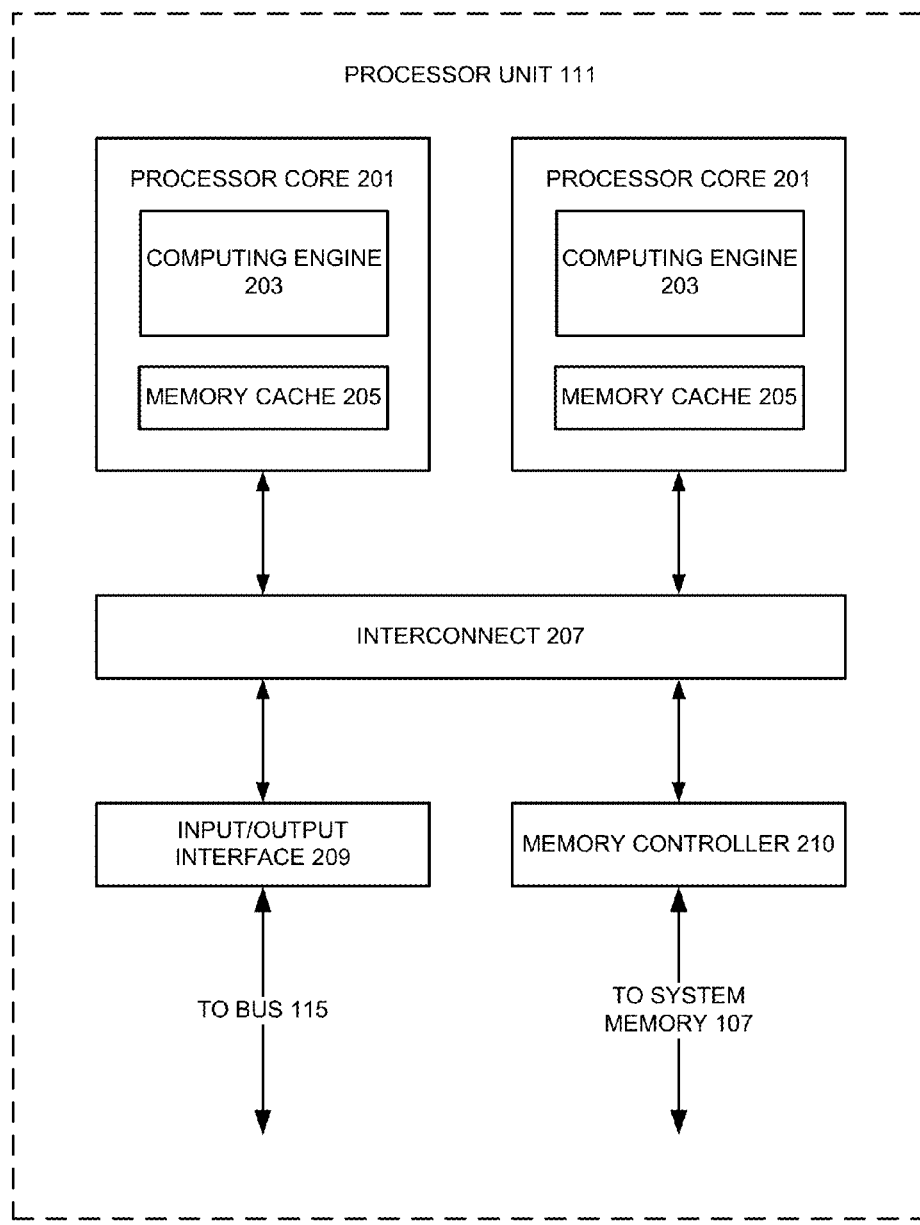
FIG. 2 illustrates an example of a multi-core processor unit that may be used to implement various embodiments of the disclosed techniques.
Figure 3:
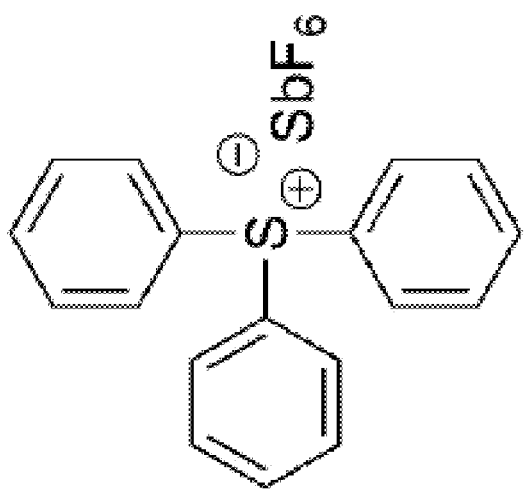
FIG. 3 illustrates an example of a chemically amplified photoresist comprising a poly(4-hydroxystyrene) (pHOST) protected by an acid-labile tert-butoxycarbonyl (t-BOC) functional group and a triphenylsulfonium hexafluoroantimonate (TPS.SbF$_6$).
Figure 3:
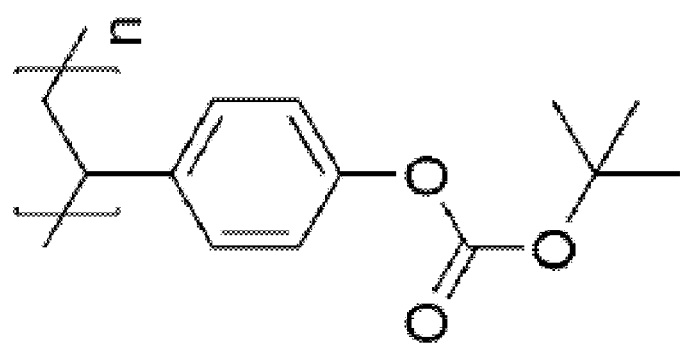
Figure 4A:
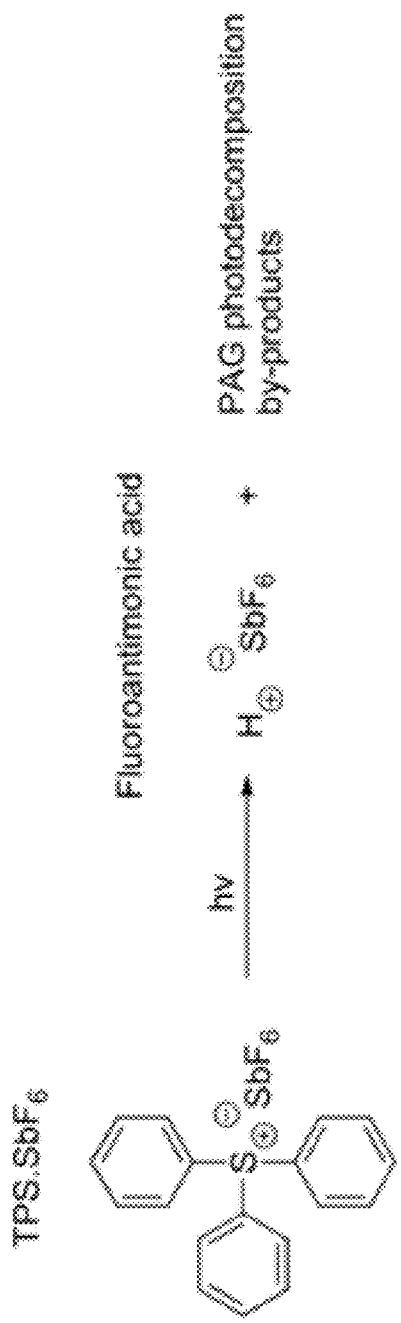
FIG. 4A illustrates an example of a photochemical reaction of a photo acid generator.
Figure 4B:
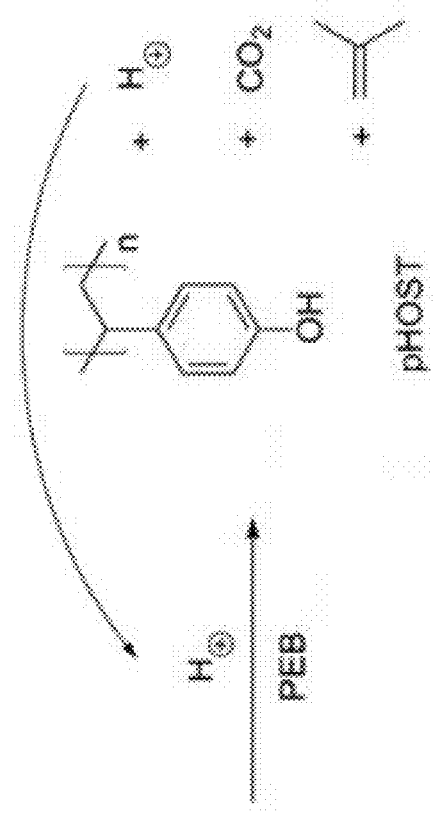
FIG. 4B illustrates an example of an acid-catalyzed deprotection reaction.
Figure 4B:
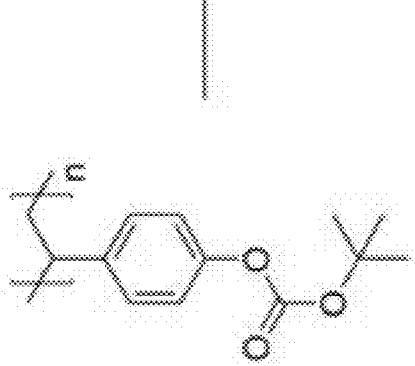

With some implementations of the disclosed techniques, the master computing device 103 may employ one or more processing units 111 having more than one processor core. Accordingly, FIG. 2 illustrates an example of a multi-core processor unit 111 that may be employed with various embodiments of the disclosed techniques. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed techniques, the processor units 111 may include additional components, such as a high-level cache memory accessible shared by the processor cores 201.

While FIG. 2 shows one illustration of a processor unit 111 that may be employed by some embodiments of the disclosed techniques, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed techniques may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed techniques, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed techniques may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed techniques, either the computer 103, one or more of the servant computers 117, or some combination of both may use two or more different interface devices 113 or 123 for communicating over multiple communication interfaces.

With various examples of the disclosed techniques, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed techniques, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed techniques.

Development Rates and Horizontal Development Bias

There are a variety of photoresists in the market, with properties optimized for various exposure and processing conditions. Most photoresists in use today are positive resists, meaning that exposure to light causes bonds in the resist to break. This scission of bonds reduces local molecular weight and increases solubility. Portions exposed to light therefore wash away when developed, leaving only the unexposed portions on the wafer. This is referred to as positive tone development. In a negative tone development process, an organic solvent is used to wash away unexposed regions of the resist film. There are also negative resists, which cross-link and form less soluble regions when exposed to light, but these are not as common in modern lithographic processes.

As noted previously, chemically amplified resists have been developed to increase sensitivity for technology nodes in deep UV. Upon exposure, the photo-acid generator (PAG) creates an acid that diffuse through the resist, removing protecting groups from the polymer chains. This deprotection reaction is a catalyzed reaction. The exposure to a single exposing photon, which could only break a single bond in the past, can break as many bonds as the catalysis (i.e., the acid) can contact. The extent and number of bonds that can be broken by the catalyst varies from resist to resist, and the distance over which the acid can diffuse to break bonds can be highly dependent on local development conditions, such as temperature and the base quencher concentration.

A resist model usually includes modeling the development step. The negative tone development may be modeled as:

$$r = r_{max} \frac{(a+1)(1-m)^n}{a+(1-m)^n} + r_{min} \quad (1)$$

$$a = r_{max} \frac{(n+1)}{(n-1)}(1-m_{TH})^n$$

$$m = \frac{C_{UnBlockedPolymer}}{C_{BlockedPolymer}^{Initial}}$$

where $m_{TH}$ is the threshold inhibitor concentration, $r_{max}$ is the dissolution rate of unexposed resist, $r_{min}$ is the dissolution rate of fully exposed resist, and n is the dissolution selectivity parameter controlling the contrast of the resist. For the positive tone development, Eq. (1) still applies except:

$$m = \frac{C_{BlockedPolymer}}{C_{BlockedPolymer}^{Initial}}$$

and $r_{max}$ is the dissolution rate of fully exposed resist, $r_{min}$ is the dissolution rate of unexposed resist.

Figure 5:
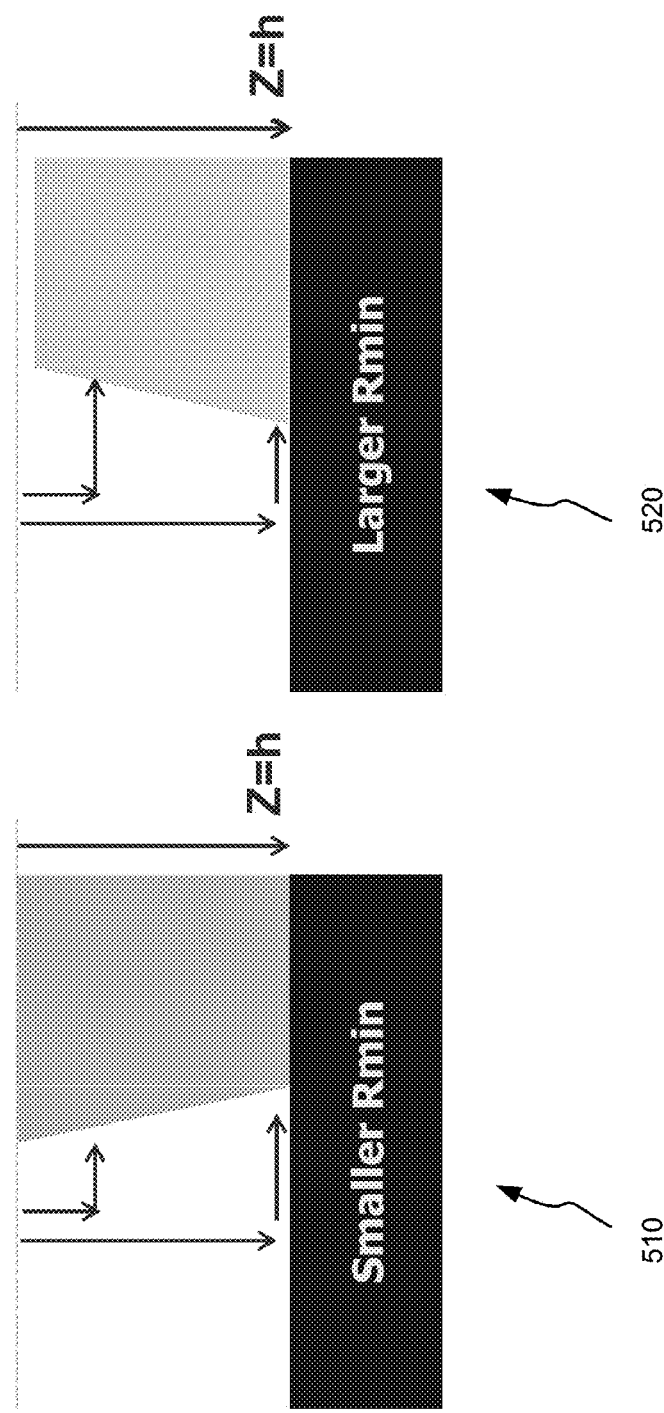
FIG. 5 illustrates one example for small $r_{min}$ resulting in a negative slope of resist profile and another example for large $r_{min}$ resulting in a positive slope of resist profile.

Compared to the positive tone development, the negative tone development has a $r_{min}$ large enough to have a non-negligible effect on the developed resist profile. The resist development path may be considered to include two parts approximately: first a vertical path and then a horizontal path. The effect of the horizontal path is herein referred to as horizontal development bias (or additional horizontal development bias). The $r_{min}$ difference may lead to different slope of resist profile. FIG. 5 illustrates an example (510) for small $r_{min}$ and an example (520) for large $r_{min}$. The horizontal development bias for 520 is significantly larger than that for 510. As a result, the resist profile of 510 has a negative slope while the resist profile of 520 have a positive slope.

As shown in FIG. 5, the horizontal development bias is z-dependent or depth-dependent. The z-dependent bias relates to horizontal development time:

$$t_{dev} = t_z + t_x \quad (2)$$

where $$t_z = \int_0^h \frac{dz}{r(x,z)} \cong \int_0^h \frac{dz}{\min(R\max, r_0[I(x0)]^\gamma)} = \frac{h}{\min(R\max, r_0[I(x0)]^\gamma)}$$

$$t_x = t_{dev}$$

For the negative tone development, assume at the horizontal development path: $r(x, z) = Rmin + r_0[I(x, z)]^\gamma$. Then the corresponding horizontal development bias is:

$$\Delta x = Rmin * t_x \cong Rmin * \left[t_{dev} - \frac{h}{\min(R\max, r_0[I(x0)]^\gamma)}\right] \quad (3)$$

$$\cong Rmin * [t_{dev} - h * \max(1/Rmax, [I(x0)]^{|\gamma|}/r_0)]$$

$$\cong Rmin * [t_{dev} - h * \max(1/Rmax, Imin^{|\gamma|}/r_0)]$$

The horizontal development bias may be incorporated into the CM1 resist model discussed in the background section by adding a horizontal development bias term into the resist surface function. The horizontal development bias term may be expressed as:

$$H(x, y) = c * \sqrt{a^2 + (I_m(x,y))^2} * \sqrt{\left(\frac{\partial I(x,y)}{\partial x}\right)^2 + \left(\frac{\partial I(x,y)}{\partial y}\right)^2} \quad (4)$$

where c is a linear coefficient, a is a constant, and the approximate minimal aerial image intensity is defined as $$I_m(x, y) = \frac{1}{2*b} * (b^2 - ((I_{-b})^2 \otimes G_s)(x, y)) \quad (5)$$

where $I_{-b}(x, y)$ is the result of the "minus" neutralization with the neutralization constant b, and $$G_s(x, y) = \frac{1}{\pi s^2} \exp\left(-\frac{x^2 + y^2}{s^2}\right) \quad (6)$$

is a Gaussian kernel with diffusion length s. To see why $I_m(x,y)$ approximately represents the minimal aerial image within the distance s from the observation point (x; y), assume that the result of the convolution:

$$((I_{-b})^2 \otimes G_s)(x,y) = (b - I_{min}(x,y))^2 \quad (7)$$

(this would be correct if the calibration with the Gaussian kernel exactly picked up the maximum within its diffusion length). Then, $I_m(x, y) = I_{min}(x, y)$ assuming that the constant b is large compared with the minimal aerial image $I_{min}(x, y)$.

The square root $\sqrt{a^2 + (I_m(x,y))^2}$ is a smooth approximation to the maximum function $\max\{a, I_m(x, y)\}$. Thus, the total horizontal bias term is an approximation to the quantity $H_b(x, y) = |\nabla I(x,y)| * \max\{a, I_{min}(x, y)\}$.

Resist Simulation Tools and Methods

Figure 6:
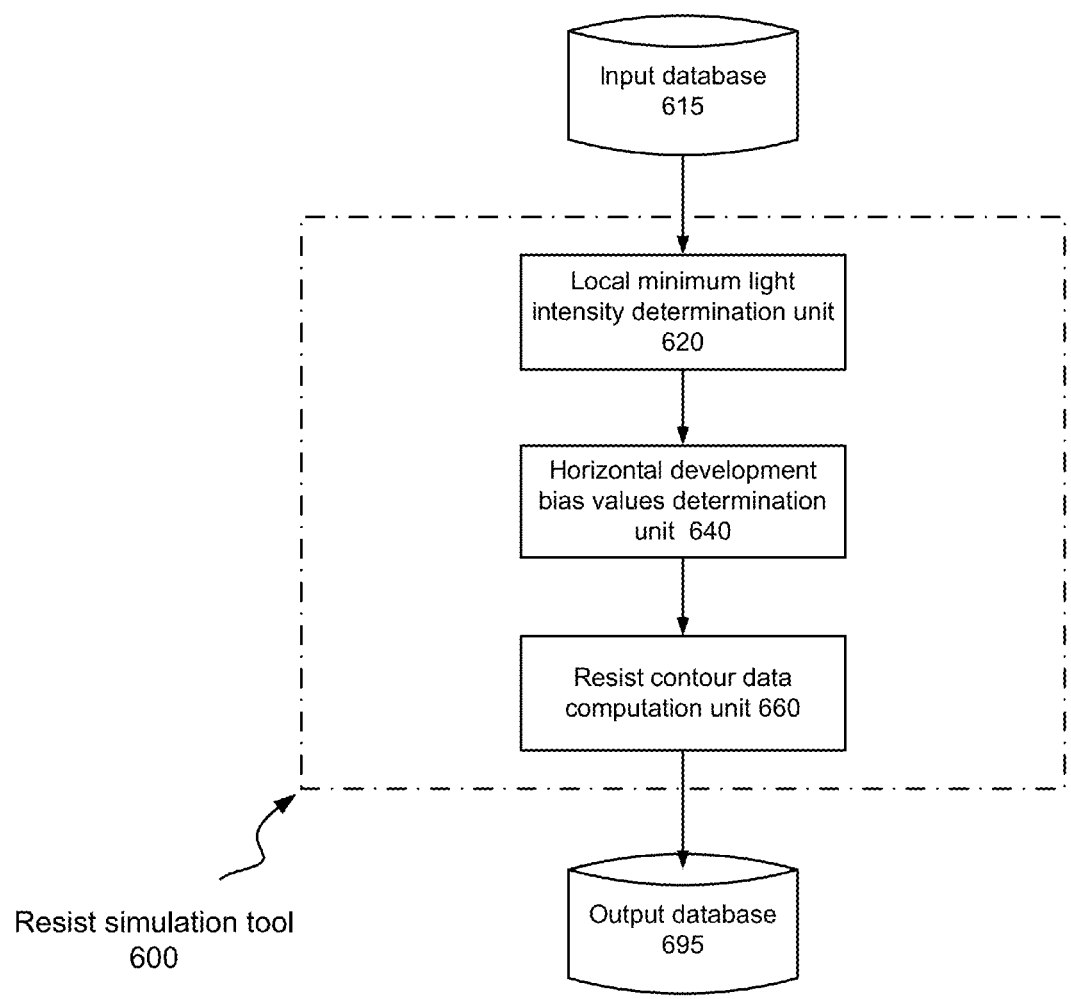
FIG. 6 illustrates an example of a resist simulation tool that may be employed according to various embodiments of the disclosed techniques

FIG. 6 illustrates an example of a resist simulation tool according to various embodiments of the disclosed techniques. As seen in the figure, the resist simulation tool 600 includes three units: a local minimum light intensity determination unit 620, a horizontal development bias values determination unit 640 and a resist contour simulation unit 660. Some implementations of the resist simulation tool 600 may cooperate with (or incorporate) one or more of an input database 615 and an output database 695.

As will be discussed in more detail below, the local minimum light intensity determination unit 620 determines local minimal light intensity values for a plurality of sample points in boundary regions of an aerial image of a feature to be printed on a resist coating, wherein each of the local minimal light intensity values represents a minimum light intensity value for an area surrounding one of the plurality of sample points. The aerial image may be obtained by an optical simulator and stored in the input database 615. Based on the local minimal light intensity values, the horizontal development bias values determination unit 640 determines horizontal development bias values for the plurality of sample points. Based at least on the horizontal development bias values, the resist contour simulation unit 660 simulates resist contour data of the feature, which may be stored in the output database 695.

As previously noted, various examples of the disclosed techniques may be implemented by a multiprocessor computing system, such as the computing system illustrated in FIGS. 1 and 2. Accordingly, one or more of the local minimum light intensity determination unit 620, the horizontal development bias values determination unit 640 and the resist contour simulation unit 660 may be implemented by executing programming instructions on one or more processors in a computing system such as the computing system illustrated in FIG. 1 and FIG. 2. Correspondingly, some other embodiments of the disclosed techniques may be implemented by software instructions, stored on a non-transitory computer-readable medium, for instructing one or more programmable computers/computer systems to perform the functions of one or more of the local minimum light intensity determination unit 620, the horizontal development bias values determination unit 640 and the resist contour simulation unit 660. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

It also should be appreciated that, while the local minimum light intensity determination unit 620, the horizontal development bias values determination unit 640 and the resist contour simulation unit 660 are shown as separate units in FIG. 6, a single servant computer (or a single processor within a master computer) may be used to implement two or more of these units at different times, or components of two or more of these units at different times.

With various examples of the disclosed techniques, the input database 615 and the output database 695 may be implemented using any suitable computer readable storage device. That is, either of the input database 615 and the output database 695 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 615 and the output database 695 are shown as separate units in FIG. 6, a single data storage medium may be used to implement some or all of these databases.

Figure 7:
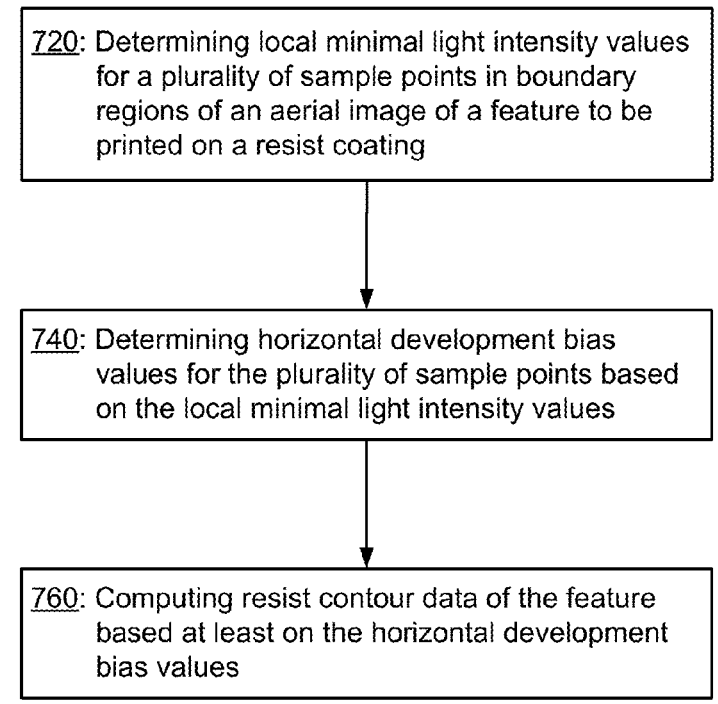
FIG. 7 illustrates a flowchart describing a process for resist simulation that may be employed by various embodiments of the disclosed techniques.
Figure 7:
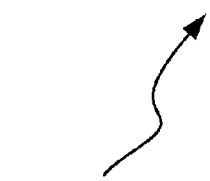

FIG. 7 illustrates a flowchart showing a process for resist simulation that may be implemented according to various examples of the disclosed techniques. For ease of understanding, methods of resist simulation that may be employed according to various embodiments of the disclosed techniques will be described with reference to the resist simulation tool 600 illustrated in FIG. 6 and the flow chart 700 in FIG. 7. It should be appreciated, however, that alternate implementations of an resist simulation tool may be used to perform the method of resist simulation shown in the flow chart 700 according to various embodiments of the disclosed techniques. In addition, it should be appreciated that implementations of the resist simulation tool 600 may be employed to implement methods of resist simulation according to different embodiments of the disclosed techniques other than the one illustrated by the flow chart 700 in FIG. 7.

In operation 720 of the flow chart 700, the local minimum light intensity determination unit 620 determines local minimal light intensity values for a plurality of sample points in boundary regions of an aerial image of a feature to be printed on a resist coating, wherein each of the local minimal light intensity values represents a minimum light intensity value for an area surrounding one of the plurality of sample points. The aerial image of the feature may be derived by an optical simulator, such as those found in the CALIBRE family of software tools available from Mentor Graphics Corporation, Wilsonville, Oreg. As noted previously, the disclosed techniques may be incorporated into the CM1 resist model. The plurality of sample points may be some of the grid points employed by the CM1 resist model that are in the boundary regions of the aerial image. The area may have a circle shape. The circle's radius may be adjusted when the resist model is calibrated. With some implementations of the disclosed techniques in which the resist simulation tool 600 employs, for example, the CM1 resist model, the local minimal light intensity values may be determined according to Eq. (5).

In operation 740, the horizontal development bias values determination unit 640 determines horizontal development bias values for the plurality of sample points based on the local minimal light intensity values. Some embodiments of the disclosed techniques use Eq. (3) to compute the horizontal development bias values. Some other embodiments of the disclosed techniques use Eq. (4) for the operation 740.

In operation 760, the resist contour simulation unit 660 computes resist contour data of the feature based at least on the horizontal development bias values. When the CM1 resist model is employed by the resist simulation tool 600, the horizontal development bias term defined by Eq. (4) is added into the resist surface function. The resist surface function may be calibrated against critical dimension data measured or calculated using a rigorous model. By using a threshold constant, the resist contour data may be derived from the resist surface function.

CONCLUSION

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method, executed by at least one processor of a computer, comprising:
   determining local minimal light intensity values for a plurality of sample points in boundary regions of an aerial image of a feature of an electronic design to be printed on a resist coating, wherein each of the local minimal light intensity values represents a minimum light intensity value for an area surrounding one of the plurality of sample points;
   determining horizontal development bias values for the plurality of sample points based on the local minimal light intensity values; and
   computing, as part of a process for verifying printability of the feature or for modifying the feature, resist contour data of the feature based at least on the horizontal development bias values.

2. The method recited in claim 1, wherein the local minimal light intensity values are determined according to $$I_m(x, y) = \frac{1}{2*b} * (b^2 - ((I_{-b})^2 \otimes G_s)(x, y)),$$

where $$G_s(x, y) = \frac{1}{\pi s^2} \exp\left(-\frac{x^2 + y^2}{s^2}\right)$$

is a Gaussian kernel with diffusion length s, $I_{-b}(x, y)$ is a result of the "minus" neutralization with the neutralization constant b, and x, y are coordinates, and wherein the horizontal development bias values are determined according to $$H(x, y) = c * \sqrt{a^2 + (I_m(x, y))^2} * \sqrt{\left(\frac{\partial I(x, y)}{\partial x}\right)^2 + \left(\frac{\partial I(x, y)}{\partial y}\right)^2}.$$

where c is a linear coefficient, a is a constant, and I(x,y) is light intensity at (x,y).

3. The method recited in claim 1, wherein the horizontal development bias values are determined according to $$\Delta x \approx R\min*[t_{dev}-h]$$

where Imin represents the local minimal light intensity values, $R_{max}$ is dissolution rate of fully exposed resist, $R_{min}$ is dissolution rate of unexposed resist, $t_{dev}$ is horizontal development time, h is depth, and γ and $r_0$ are constants.

4. A non-transitory processor-readable medium storing processor-executable instructions for causing one or more processors to perform a method, the method comprising:
   determining local minimal light intensity values for a plurality of sample points in boundary regions of an aerial image of a feature of an electronic design to be printed on a resist coating, wherein each of the local minimal light intensity values represents a minimum light intensity value for an area surrounding one of the plurality of sample points;
   determining horizontal development bias values for the plurality of sample points based on the local minimal light intensity values; and
   computing, as part of a process for verifying printability of the feature or for modifying the feature, resist contour data of the feature based at least on the horizontal development bias values.

5. The non-transitory processor-readable medium recited in claim 4, wherein the local minimal light intensity values are determined according to $$I_m(x, y) = \frac{1}{2*b} * (b^2 - ((I_{-b})^2 \otimes G_s)(x, y)),$$

where $$G_s(x, y) = \frac{1}{\pi s^2} \exp\left(-\frac{x^2 + y^2}{s^2}\right)$$

is a Gaussian kernel with diffusion length s, $I_{-b}(x, y)$ is a result of the "minus" neutralization with the neutralization constant b, and x, y are coordinates,
and wherein the horizontal development bias values are determined according to $$H(x, y) = c * \sqrt{a^2 + (I_m(x, y))^2} * \sqrt{\left(\frac{\partial I(x, y)}{\partial x}\right)^2 + \left(\frac{\partial I(x, y)}{\partial y}\right)^2}$$

where c is a linear coefficient, a is a constant, and I(x,y) is light intensity at (x,y).

6. The non-transitory processor-readable medium recited in claim 4, wherein the horizontal development bias values are determined according to $$\Delta x \approx R\min*[t_{dev}-h]$$

where Imin represents the local minimal light intensity values, $R_{max}$ is dissolution rate of fully exposed resist, $R_{min}$ is dissolution rate of unexposed resist, $t_{dev}$ is horizontal development time, h is depth, and γ and $r_0$ are constants.

7. A system, comprising:
   a local minimum light intensity determination unit configured to determine local minimal light intensity values for a plurality of sample points in boundary regions of an aerial image of a feature of an electronic design to be printed on a resist coating, wherein each of the local minimal light intensity values represents a minimum light intensity value for an area surrounding one of the plurality of sample points;

a horizontal development bias values determination unit configured to determine horizontal development bias values for the plurality of sample points based on the local minimal light intensity values; and a resist contour simulation unit configured to compute, as part of a process for verifying printability of the feature or for modifying the feature, resist contour data of the feature based at least on the horizontal development bias values.

8. The system recited in claim 7, wherein the local minimal light intensity values are determined according to $$I_m(x, y) = \frac{1}{2*b} * (b^2 - ((I_{-b})^2 \otimes G_s)(x, y)),$$

where $$G_s(x, y) = \frac{1}{\pi s^2} \exp\left(-\frac{x^2 + y^2}{s^2}\right)$$

is a Gaussian kernel with diffusion length s, $I_{-b}(x, y)$ is a result of the "minus" neutralization with the neutralization constant b, and x, y are coordinates, and wherein the horizontal development bias values are determined according to $$H(x, y) = c * \sqrt{a^2 + (I_m(x, y))^2} * \sqrt{\left(\frac{\partial I(x, y)}{\partial x}\right)^2 + \left(\frac{\partial I(x, y)}{\partial y}\right)^2}$$

where c is a linear coefficient, a is a constant, and I(x,y) is light intensity at (x,y).

9. The system recited in claim 7, wherein the horizontal development bias values are determined according to $$\Delta x \approx R\min*[t_{dev}-h$$

where Imin represents the local minimal light intensity values, $R_{max}$ is dissolution rate of fully exposed resist, $R_{min}$ is dissolution rate of unexposed resist, $t_{dev}$ is horizontal development time, h is depth, and γ and $r_0$ are constants.

* * * * *